United States Patent
Mae et al.

(10) Patent No.: US 10,222,692 B2
(45) Date of Patent: Mar. 5, 2019

(54) PHOTOMASK AND MANUFACTURING METHOD OF SEMICONDUCTOR DEVICE

(71) Applicant: Toshiba Memory Corporation, Minato-ku (JP)

(72) Inventors: Masaki Mae, Yokkaichi (JP); Suigen Kanda, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 79 days.

(21) Appl. No.: 15/422,654

(22) Filed: Feb. 2, 2017

(65) Prior Publication Data

US 2018/0157159 A1 Jun. 7, 2018

Related U.S. Application Data

(60) Provisional application No. 62/429,321, filed on Dec. 2, 2016.

(51) Int. Cl.
| | |
|---|---|
| *G03F 1/50* | (2012.01) |
| *G03F 1/60* | (2012.01) |
| *G03F 1/70* | (2012.01) |
| *G03F 1/76* | (2012.01) |
| *G03F 7/16* | (2006.01) |
| *G03F 7/20* | (2006.01) |
| *G03F 7/26* | (2006.01) |
| *G03F 7/095* | (2006.01) |
| *H01L 21/027* | (2006.01) |
| *H01L 21/311* | (2006.01) |
| *H01L 27/11575* | (2017.01) |
| *H01L 27/11582* | (2017.01) |

(52) U.S. Cl.
CPC .............. *G03F 1/50* (2013.01); *G03F 1/60* (2013.01); *G03F 1/70* (2013.01); *G03F 1/76* (2013.01); *G03F 7/095* (2013.01); *G03F 7/16* (2013.01); *G03F 7/2006* (2013.01); *G03F 7/2008* (2013.01); *G03F 7/2022* (2013.01); *G03F 7/26* (2013.01); *H01L 21/0274* (2013.01); *H01L 21/31111* (2013.01); *H01L 21/31144* (2013.01); *H01L 27/11575* (2013.01); *H01L 27/11582* (2013.01)

(58) Field of Classification Search
CPC ................. G03F 1/50; G03F 1/60; G03F 1/70
USPC ........................................................... 430/5
See application file for complete search history.

(56) References Cited

U.S. PATENT DOCUMENTS 7,855,457 B2    12/2010   Mizukami et al.
9,076,705 B2 *   7/2015   Arai .................. H01L 27/1461

FOREIGN PATENT DOCUMENTS

| JP | 7-240361    | 9/1995 |
| JP | 2009-16400  | 1/2009 |
| JP | 2010-102008 | 5/2010 |

* cited by examiner

*Primary Examiner* — Christopher G Young
(74) *Attorney, Agent, or Firm* — Oblon, McClelland, Maier & Neustadt, L.L.P.

(57) ABSTRACT

A photomask according to the embodiment includes a glass substrate which has a first face and a second face located on a side opposite from the first face. The second face includes a transmission area and a light shielding area corresponding to an exposure pattern of a resist film exposed via the glass substrate. The transmission area is oblique to the first face.

3 Claims, 10 Drawing Sheets

PHOTOMASK AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/429,321, filed on Dec. 2, 2016; the entire contents of which are incorporated herein by reference.

FIELD

An embodiment of the present invention is related to a photomask and manufacturing method of a semiconductor device.

BACKGROUND

A three-dimensional memory stacked the memory cells is known as a method to increase a capacity of a semiconductor memory. In the three-dimensional memory, an end of a stacked body having a plurality of memory cells is formed as stair-shaped, and the contact holes are formed to reach each stair. Each memory cell is electrically connected to a wiring located on the stacked body via this contact hole.

In forming the above-mentioned stair-shaped, a resist film is formed on the above-mentioned stacked body, and this resist film is exposed via a photomask, for example.

DETAILED DESCRIPTION

Embodiments will now be explained with reference to the accompanying drawings. The present invention is not limited to the embodiments.

A photomask according to the embodiment includes a glass substrate which has a first face and a second face located on a side opposite from the first face. The second face includes a transmission area and a light shielding area corresponding to an exposure pattern of a resist film exposed via the glass substrate. The transmission area is oblique to the first face.

Figure 1:
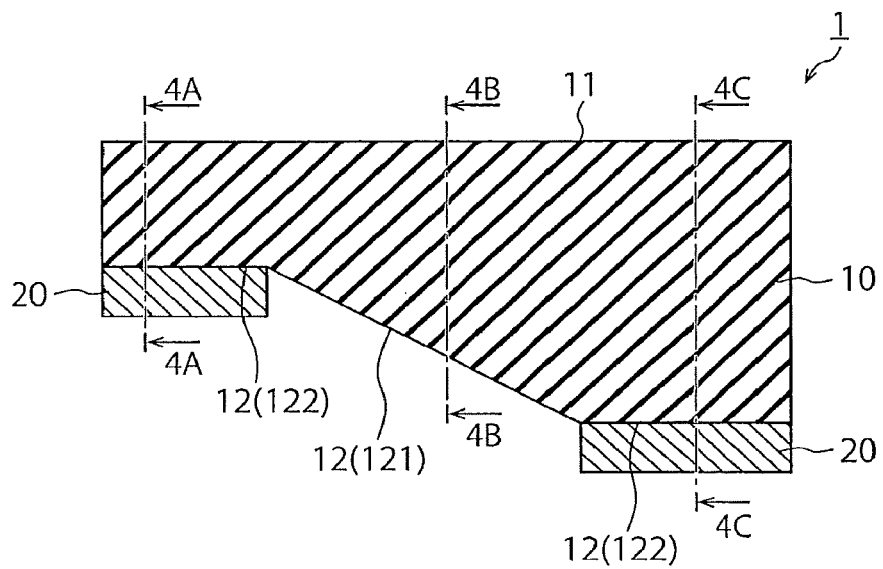
FIG. 1 is a sectional view of a photomask according to the embodiment.

FIG. 1 is a sectional view of a photomask 1 according to the embodiment. The photomask 1 includes a glass substrate 10 having a first face 11 and a second face 12.

Figure 2:
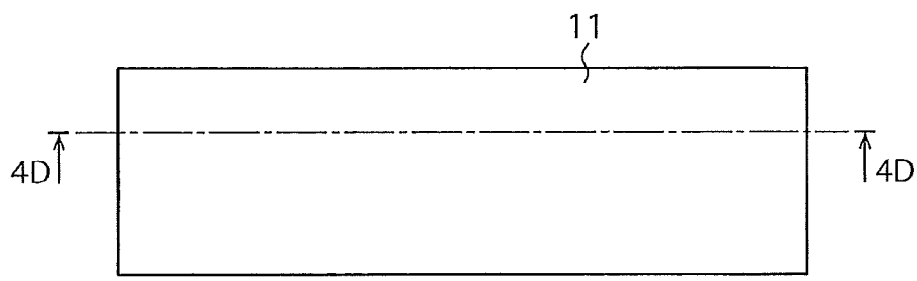
FIG. 2 is a plan view of a first face of a glass substrate.
Figure 3:
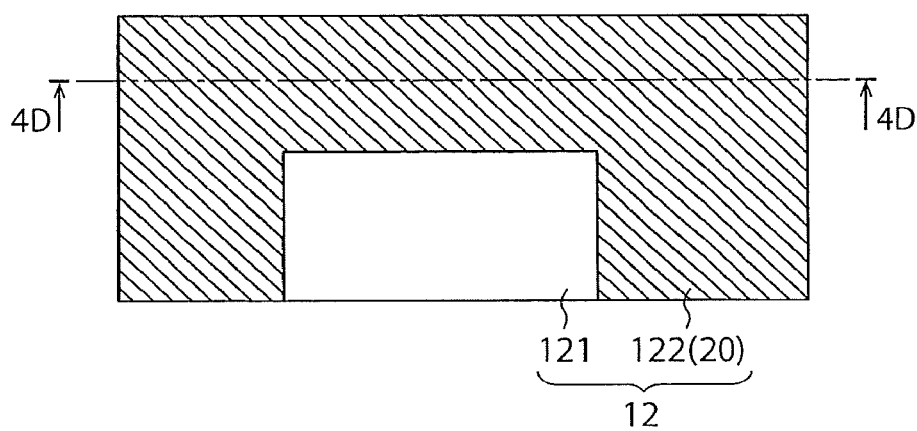
FIG. 3 is a plan view of a second face of a glass substrate.
Figure 4A:
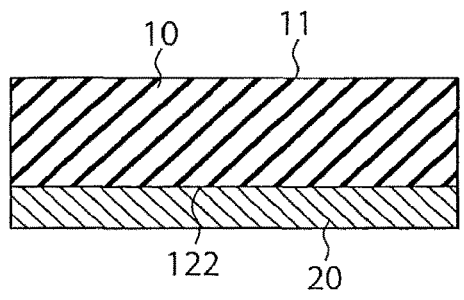
FIGS. 4A to 4D are sectional views respectively according section lines 4A to 4D shown in FIGS. 1 to 3.
Figure 4B:
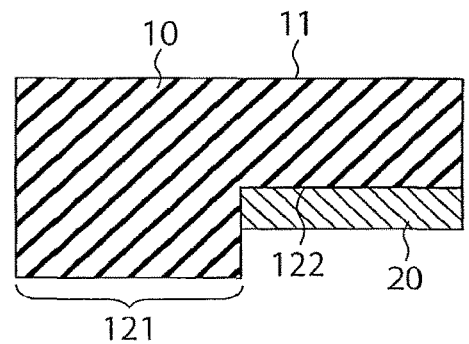
Figure 4C:
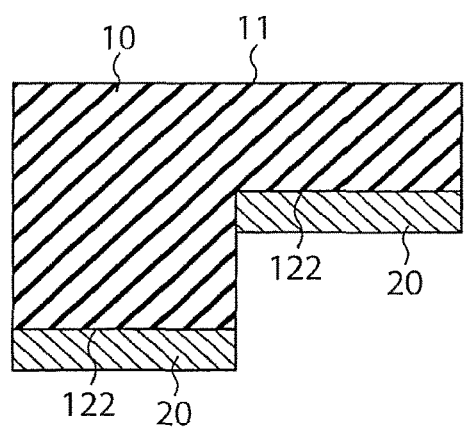
Figure 4D:
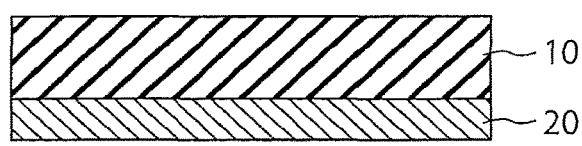

FIG. 2 is a plan view of the first face 11, and FIG. 3 is a plan view of the second face 12. Light enters the first face 11. The first face 11 is a transparent flat face. On the other hand, the second face 12 includes a transmission area 121 and a light shielding area 122, as shown in FIG. 3.

The transmission area 121 is oblique to the first face 11, and transmits the light entering the first face 11, as shown in FIG. 1. This transmission light exposes a resist film formed on a processed substrate. On the other hand, the light shielding area 122 has a light shielding film 20 including chromium (Cr). The light shielding film 20 shades the light entering the first face 11. That is, the transmission area 121 and the light shielding area 122 form a mask pattern corresponding to an exposure pattern of the above-mentioned resist film.

Figure 5:
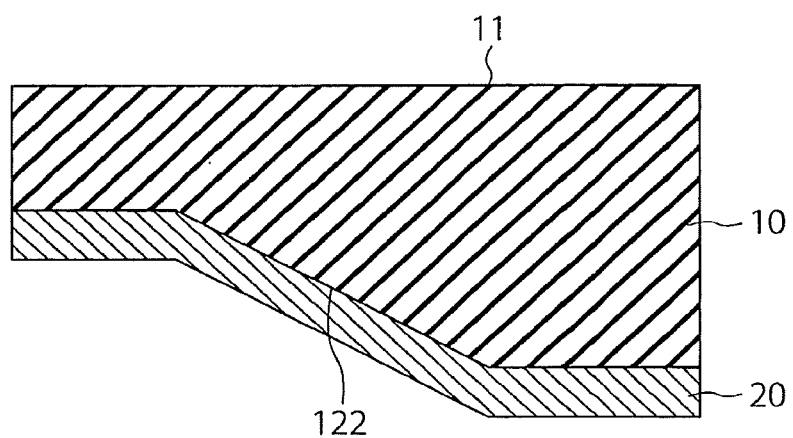
FIG. 5 is a sectional view showing another embodiment of a light shielding area.

FIGS. 4A to 4D are sectional views respectively corresponding to the section lines 4A to 4D shown in FIGS. 1 to 3. As shown in each figure, in the embodiment, the light shielding area 122 covered by the light shielding film 20 is parallel to the first face 11 without being oblique to the first face 11. However, the light shielding area 122 may be oblique to the first face 11 just like the transmission area 121, as shown in FIG. 5. FIG. 5 is a sectional view corresponding to the section line 4D shown in FIGS. 2 and 3.

Hereinafter, a manufacturing method of the photomask 1 according to the embodiment is explained with reference to FIG. 6 to FIG. 11.

Figure 6:
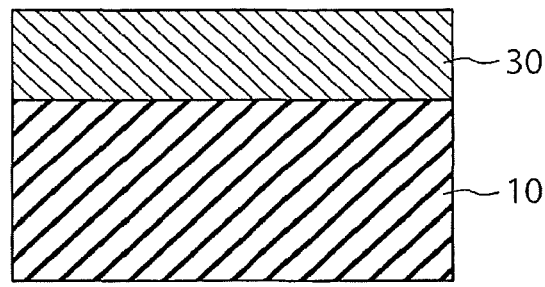
FIG. 6 to FIG. 11 are the sectional views showing a manufacturing process of the photomask according to the embodiment.
Figure 7:
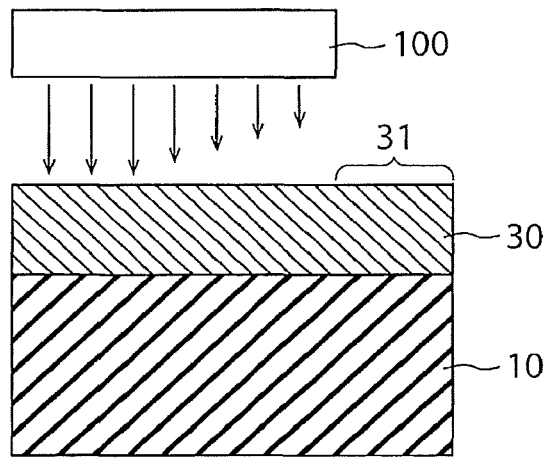

At first, as shown in FIG. 6, a resist film 30 is formed on the glass substrate 10. Then, as shown in FIG. 7, an electronic beam exposure apparatus 100 exposes the resist film 30. In this process, the electronic beam exposure apparatus 100 exposes an exposure area except a non-exposure area 31 on the resist film 30. The electronic beam exposure apparatus 100 changes a dose of an electron beam to form an inclined face on the resist film 30. Concretely, the dose of the electron beam decreases toward the non-exposure area 31.

Figure 8:
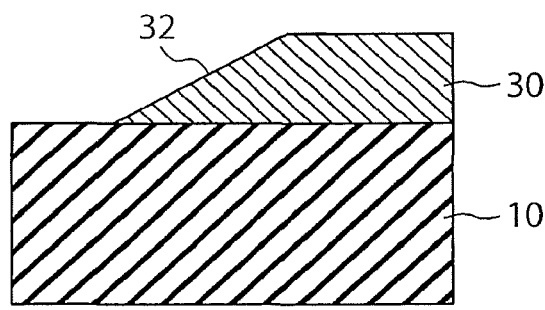
Figure 9:
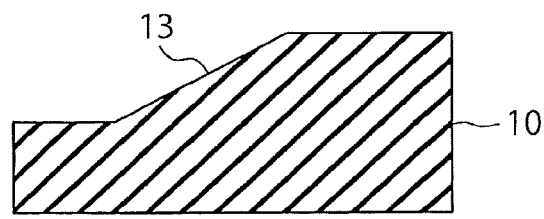

Subsequently, an inclined face 32 as shown in FIG. 8 is formed on the resist film 30 in developing the resist film 30. Then, dry etching of the glass substrate 10 is carried out, using this resist film 30 as a mask. As a result, an inclined face 13 is formed on the glass substrate 10 as shown in FIG.

9. This inclined face 13 is equivalent to the transmission area 121 mentioned above. The inclined face 13 may be formed using isotropic etching of wet etching.

Figure 10:
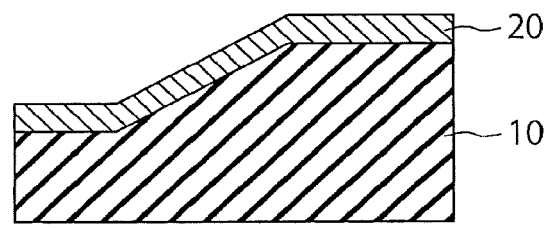
Figure 11:
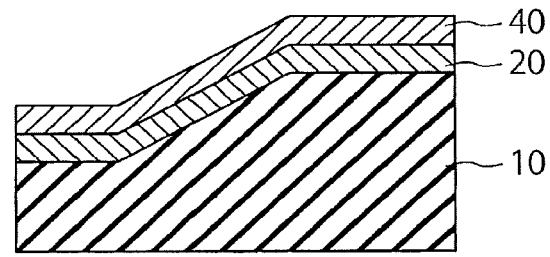

Subsequently, as shown in FIG. 10, the light shielding film 20 is formed on the glass substrate 10 by sputtering chromium. In this process, the light shielding film 20 is also formed on the inclined face 13 of the glass substrate 10. Then, as shown in FIG. 11, a resist film 40 is formed on the light shielding film 20. Finally, the light shielding film 20 formed on the inclined face 13 is removed by processes such as exposure, development, and dry etching. In this manner, the photomask 1 shown in FIG. 1 is formed.

Next, a manufacturing method of a semiconductor device using the photomask 1 according to the embodiment is explained. Here, some processes of a three-dimensional memory stacked a plurality of memory cells is explained.

Figure 12:
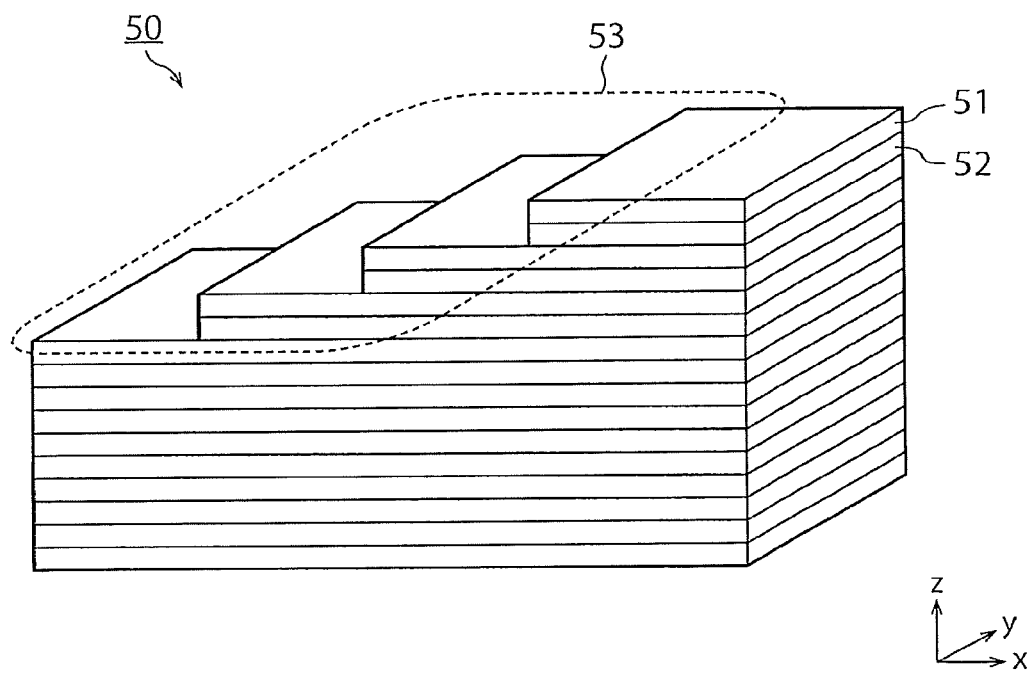
FIG. 12 is a perspective view of a processed substrate in an initial state.

In manufacturing the three-dimensional memory, a processed substrate 50 is formed as shown in FIG. 12. The processed substrate 50 is a stacked body having a plurality of silicon oxide films 51 ($SiO_2$) and a plurality of silicon nitride films 52 (SiN) being alternately stacked. A stairs area 53 is formed on the processed substrate 50. The stairs area 53 has steps in the x direction which is perpendicular to a stacking direction z.

Figure 13A:
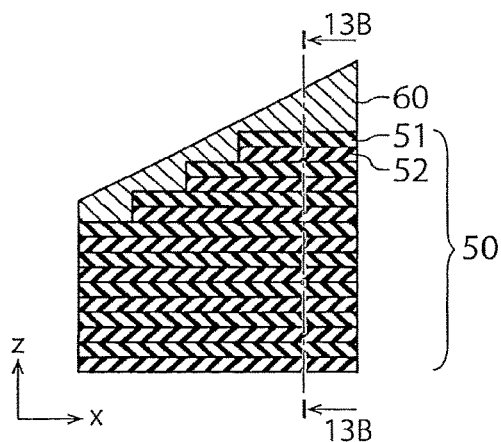
FIG. 13A is a side view of a manufacturing process of a semiconductor device using the photomask according to the embodiment.
Figure 13B:
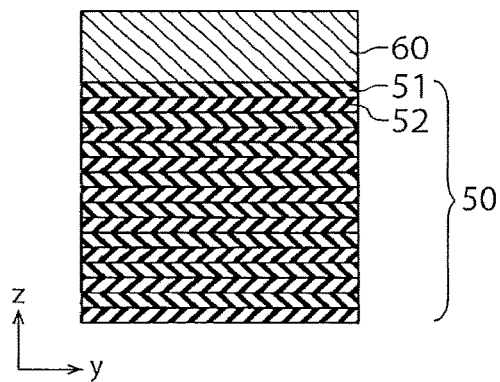
FIG. 13B is a sectional view of a manufacturing process of a semiconductor device using the photomask according to the embodiment.
Figure 14A:
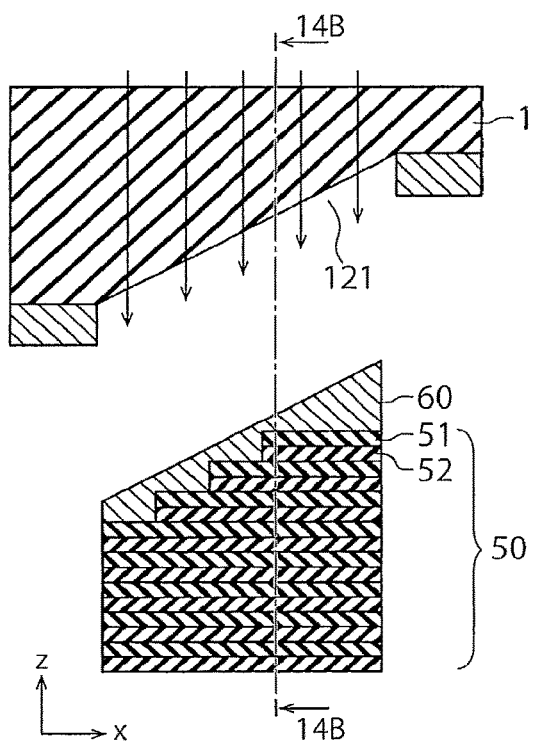
FIG. 14A is another side view of a manufacturing process of a semiconductor device according to the embodiment.

In forming the processed substrate 50, a resist film 60 is firstly formed on the processed substrate 50, as shown in side view FIG. 13A and sectional view FIG. 13B. Then, the resist film is exposed via the photomask 1 according to the embodiment, as shown in side view FIG. 14A and sectional view FIG. 14B.

Figure 14B:
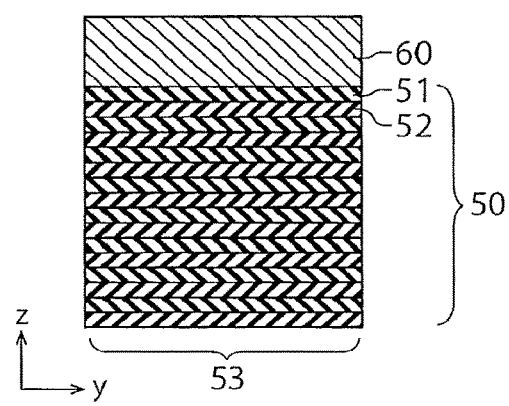
FIG. 14B is another sectional view of a manufacturing process of a semiconductor device according to the embodiment.

The exposure uses a KrF exciplex laser light of which a wavelength is 248 nm or ArF exciplex laser light of which a wavelength is 193 nm, for exposure. In this exposure process, the transmission area 121 of the photomask 1 faces a portion for removing the stairs area 53, and the light shielding area 122 faces a portion for remaining the stairs area 53, as shown in FIG. 14B.

Figure 15A:
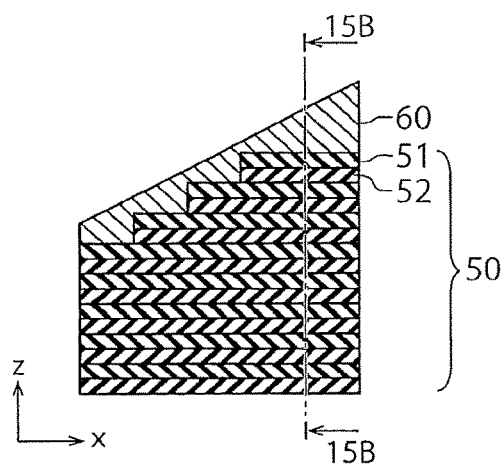
FIG. 15A is a further side view of a manufacturing process of a semiconductor device according to the embodiment.
Figure 15B:
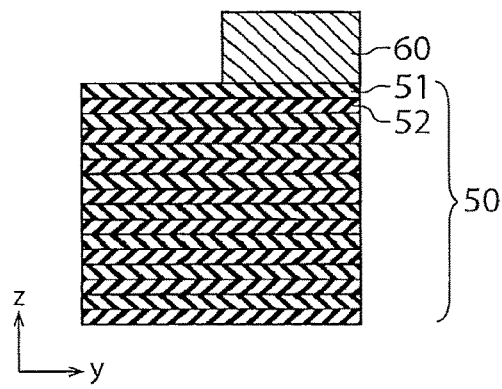
FIG. 15B is a further sectional view of a manufacturing process of a semiconductor device according to the embodiment.
Figure 16A:
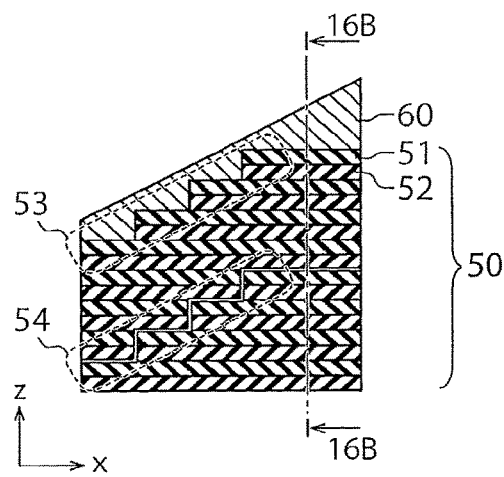
FIG. 16A is a still further side view of a manufacturing process of a semiconductor device according to the embodiment.
Figure 16B:
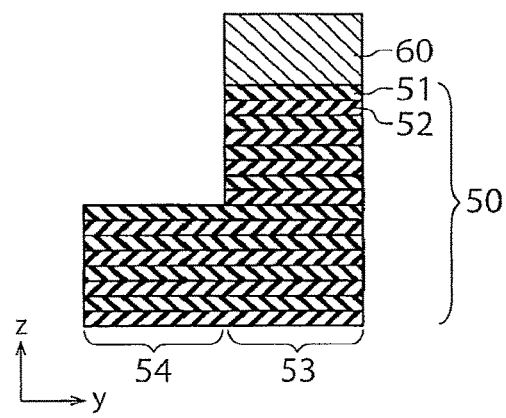
FIG. 16B is a still further sectional view of a manufacturing process of a semiconductor device according to the embodiment.

Subsequently, the resist film 60 is developed as shown in side view FIG. 15A and sectional view FIG. 15B. Thereby, the mask pattern of the photomask 1 is transferred to the processed substrate 50. Then dry etching of the processed substrate 50 is carried out, using the resist film 60 as a mask, as shown in side view FIG. 16A and sectional view FIG. 16B. Thereby, a stairs area 54 is formed under the processed substrate 50. The stairs area 54 also has a step in the x direction just like the stairs area 53.

Figure 17:
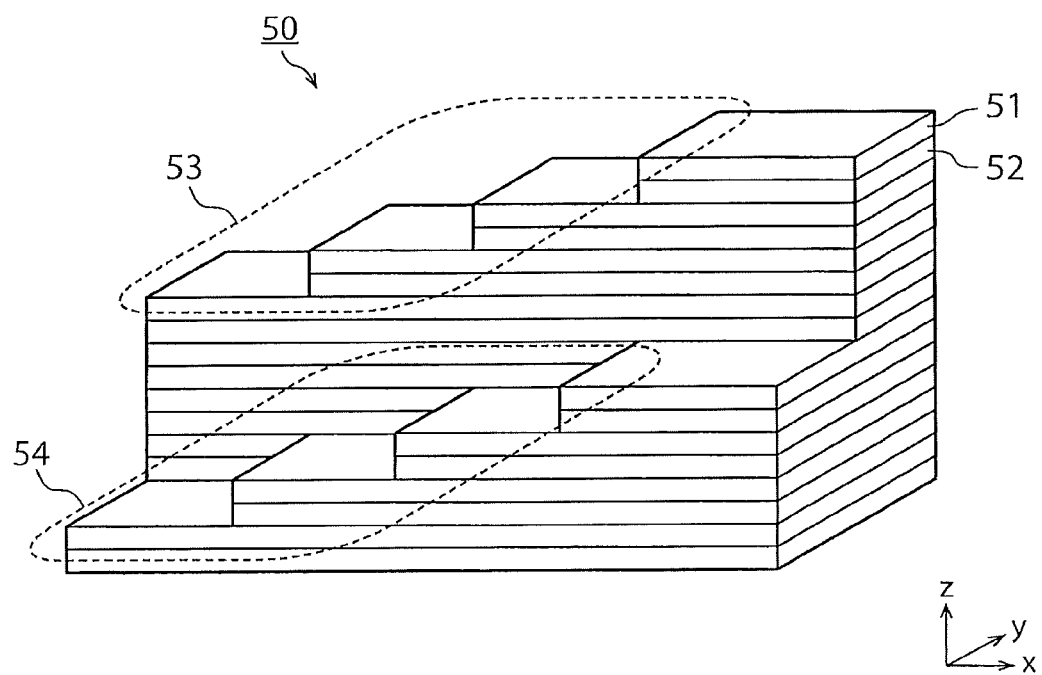
FIG. 17 is a perspective view of the processed substrate in a finished state.

Subsequently, the resist film 60 is removed by oxygen ashing. As a result, a pattern formation of the processed substrate 50 is completed. On the processed substrate 50 formed the pattern, the stairs area 53 and 54 are formed in the respectively different layer, as shown in FIG. 17. The stairs area 54 is beneath the stairs area 53 and is formed in the y direction (in front of the stairs area 53 in FIG. 17). That is, in the embodiment, two stairs area 53 and 54 are formed in two directions, namely the x direction and the y direction which is perpendicular to the x direction. Therefore, a width of the stairs area can be shorter than a structure, which these stairs area are continuously formed in only one direction. There may be three or more stairs area, and the number of steps of each stairs area is not restricted.

Subsequently, each silicon nitride film 52 in the processed substrate 50 is replaced by a conductive layer (not shown) including tungsten (W), for example. Each conductive layer is electrically connected with each memory cell. Then, a contact hole is formed to reach each step of the stairs areas 53 and 54. Each memory cell is electrically connected to a wiring (not shown) formed on the processed substrate 50 via this contact hole.

In processing the processed substrate 50 having a stair-shaped upper part, when the number of stacks of the processed substrate 50 is increased to maximize the capacity of a memory, the number of steps of the stairs area 53 also increases, and a level difference between a top step and a bottom step is greater. Therefore, if the transmission area 121 of the photomask 1 is parallel to the first face 11, the above-mentioned level difference easily causes a best focus difference in the exposure of the resist film 60. The best focus difference may lower the processing performance of the resist film 60.

However, according to the above mentioned embodiment, the transmission area 121 is oblique to the level difference of the stairs area 53, in other words, an inclination of the stairs area 53. Therefore, a clearance between each of the steps of the stairs area 53 and the transmission area 121 is mostly equal thereby the best focus difference due to the level difference can be reduced.

Figure 18:
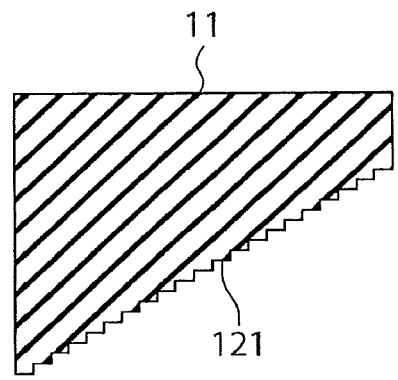
FIG. 18 is a sectional view showing another embodiment of a transmission area.

In the embodiment, the transmission area 121 is formed as slope shape where a distance to the first face 11 continuously decreases, as shown in FIG. 1, However, the shape of the transmission area 121 may be formed as stair-shaped where the distance to the first face 11 decreases step-by-step as shown in FIG. 18, for example. In this case, if the number of steps of the transmission area 121 is equal to that of the stairs area 53, the transmission area 121 will have a shape similar to that of the stairs area 53. Thereby, the best focus difference can be further reduced.

Figure 19:
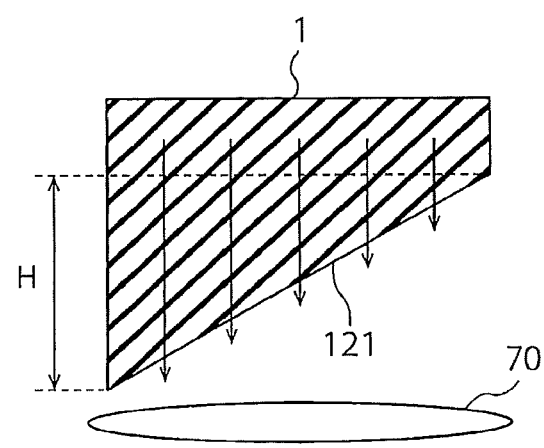
FIG. 19 shows an exposure process using a projection lens.
Figure 19:
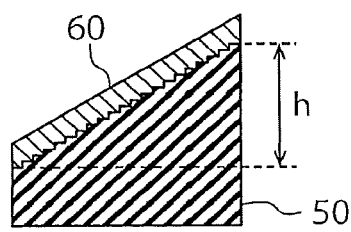

Moreover, when the exposure pattern for the resist film 60 is reduced by a projection lens 70 shown in FIG. 19, a height H of the transmission area 121 preferably defines on the basis of $H=h \times n^2$. "h" means the level difference between the top step and the bottom step in the stairs area 53 preliminarily formed on the processed substrate 50. "n" means a reduction rate of the projection lens 70. For example, when "n" is equal to 4, the height H of the transmission area 121 is 16 times the level difference h of the stairs area 53. Thus, the best focus difference can theoretically be almost zero by defining the height H of the transmission area 121 based on the reduction rate of the projection lens 70.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A photomask comprising:
    a glass substrate including a first face and a second face located on a side opposite from the first face, wherein the second face includes a transmission area and a light shielding area corresponding to an exposure pattern of a resist film exposed via the glass substrate,
    the transmission area is oblique to the first face,
    the transmission area is formed as a slope shape where a distance to the first face continuously decreases or a stair shape where a distance to the first face decreases step-by-step, and
    the transmission area is rectangular in a planar view.

2. The photomask according to claim 1, wherein
the resist film is located on a stairs area formed on a processed substrate,
the exposure pattern is reduced with a projection lens located between the glass substrate and the processed substrate, and
a height of the transmission area is defined by multiplying a level difference between a top step and a bottom step in the stairs area by a squared of a reduction rate of the projection lens.

3. The photomask according to claim 1, wherein
the resist film is located on a stairs area formed on a processed substrate, the number of steps of the transmission area is equal to that of the stairs area.

* * * * *